United States Patent
Orlowski et al.

(10) Patent No.: US 7,045,432 B2
(45) Date of Patent: May 16, 2006

(54) METHOD FOR FORMING A SEMICONDUCTOR DEVICE WITH LOCAL SEMICONDUCTOR-ON-INSULATOR (SOI)

(75) Inventors: Marius K. Orlowski, Austin, TX (US); Olubunmi O. Adetutu, Austin, TX (US); Alexander L. Barr, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 166 days.

(21) Appl. No.: 10/771,855

(22) Filed: Feb. 4, 2004

(65) Prior Publication Data
US 2005/0170604 A1   Aug. 4, 2005

(51) Int. Cl.
*H01L 21/20* (2006.01)
*H01L 21/36* (2006.01)

(52) U.S. Cl. .................. 438/300; 438/509; 438/770
(58) Field of Classification Search .................. 438/773
See application file for complete search history.

(56) References Cited

U.S. PATENT DOCUMENTS

| | | | |
|---|---|---|---|
| 6,369,438 B1 | 4/2002 | Sugiyama et al. | |
| 6,429,084 B1 * | 8/2002 | Park et al. | 438/305 |
| 2002/0097608 A1 | 7/2002 | Skotnicki et al. | |
| 2002/0102775 A1 * | 8/2002 | Houng et al. | 438/143 |
| 2002/0135020 A1 | 9/2002 | Skotnicki et al. | |

OTHER PUBLICATIONS

Monfray, S. et al.; "First 80nm SON (Silicon-On-Nothing) MOSFETs with perfect morphology and high electrical performance"; IEEE; 2001; pp. 29.7.1-29.7.4.
Jurczak, Malgorzata et al.; "Silicon-on-Nothing (SON)—an Innovative Process for Advanced CMOS"; IEEE Transactions on Electron Devices,; Nov. 2000; vol. 47; No. 11, pp. 2179-2187.

* cited by examiner

*Primary Examiner*—Stephen W. Smoot
(74) *Attorney, Agent, or Firm*—Joanna G. Chiu; James L. Clingan, Jr.

(57) ABSTRACT

A semiconductor on insulator transistor is formed beginning with a bulk silicon substrate. An active region is defined in the substrate and an oxygen-rich silicon layer that is monocrystalline is formed on a top surface of the active region. On this oxygen-rich silicon layer is grown an epitaxial layer of silicon. After formation of the epitaxial layer of silicon, the oxygen-rich silicon layer is converted to silicon oxide while at least a portion of the epitaxial layer of silicon remains as monocrystalline silicon. This is achieved by applying high temperature water vapor to the epitaxial layer. The result is a silicon on insulator structure useful for making a transistor in which the gate dielectric is on the remaining monocrystalline silicon, the gate is on the gate dielectric, and the channel is in the remaining monocrystalline silicon under the gate.

26 Claims, 3 Drawing Sheets

METHOD FOR FORMING A SEMICONDUCTOR DEVICE WITH LOCAL SEMICONDUCTOR-ON-INSULATOR (SOI)

FIELD OF THE INVENTION

The present invention relates generally to semiconductor processing, and more specifically, to forming semiconductor devices with local semiconductor-on-insulator (SOI).

RELATED ART

Semiconductor-on-insulator (SOI) devices generally have superior properties over bulk devices. SOI devices are typically formed with SOI wafers, which include a layer of semiconductor material, a layer of oxide overlying the semiconductor material, and another layer of semiconductor material overlying the oxide layer. The semiconductor material can be a variety of different types of semiconductor materials such as, for example, silicon, silicon germanium, etc. However, SOI wafers are more expensive than bulk semiconductor wafers. Furthermore, it is expensive and time consuming to transfer existing circuit designs from bulk substrates to SOI substrates. Therefore, a need exists for a method which provides a cost effective method for providing higher quality SOI devices while allowing for the use of existing circuit designs fashioned for bulk substrates, when desired.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As described above, SOI wafers are typically more expensive than bulk wafers; however, SOI devices generally have superior properties as compared to bulk devices. Furthermore, many existing designs use bulk devices and the conversion of these existing devices to SOI designs such that they can be formed on an SOI wafer becomes expensive in terms of processing and design costs. Therefore, one embodiment of the present invention described herein allows for the formation of local SOI regions on a bulk semiconductor substrate. In this manner, local SOI regions may be formed on a bulk wafer where needed for improved device properties while still allowing for bulk designs to be integrated on a same wafer. Any number of local SOI regions may be formed on a wafer and these SOI regions may be of any size. In one embodiment, an SOI region may cover an entire bulk wafer.

Figure 1:
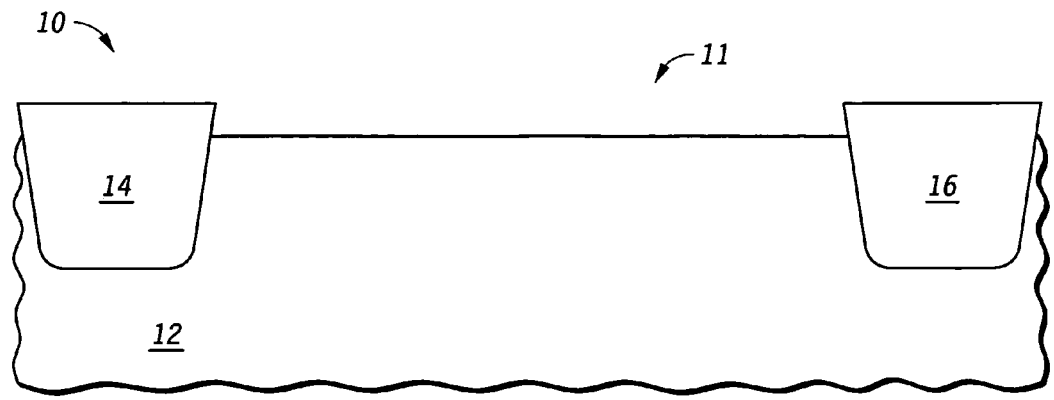
FIG. 1 illustrates a cross-sectional view of a semiconductor substrate having isolation regions in accordance with one embodiment of the present invention.

FIG. 1 illustrates a cross-section view of a semiconductor device 10 having a semiconductor substrate 12 and isolation regions 14 and 16. In one embodiment, semiconductor substrate 12 is a bulk silicon substrate. In alternate embodiments, semiconductor substrate 12 may be any type of substrate of any type of material. For example, substrate 12 may be a silicon-germanium or gallium arsenide substrate. In the illustrated embodiment, isolation regions 14 and 16 are formed within semiconductor substrate 12. An active region 11 of semiconductor substrate 12 includes the semiconductor portions of semiconductor substrate 12. For example, in the case of a bulk silicon substrate, active region 11 of FIG. 1 includes the silicon portions of substrate 12 surrounding isolation regions 14 and 16.

In one embodiment, isolation regions 14 and 16 are shallow trench isolation (STI) regions formed using conventional processing. In one embodiment, during formation of the STI regions (e.g. isolation regions 14 and 16), a top surface (i.e. a top exposed surface) of active region 11 of substrate 12 is recessed as compared to the top surfaces of isolation regions 14 and 16. However, in alternate embodiments, the top surface of active region 11 of substrate 12 may be recessed or further recessed after formation of isolation regions 14 and 16. In yet another embodiment, the top surface of active region 11 of substrate 12 may not be recessed such that the top surface of active region 11 is substantially coplanar with the top surfaces of isolation regions 14 and 16. Furthermore, isolation regions 14 and 16 may be any type of isolation region, such as, for example, LOCOS (LOCal Oxidation of Silicon) regions. Isolation regions 14 and 16 may be formed using any type of conventional processing. Also, in an alternate embodiment, isolation regions 14 and 16 may not be present at this point. For example, they may be formed later during processing, as will be described below.

Figure 2:
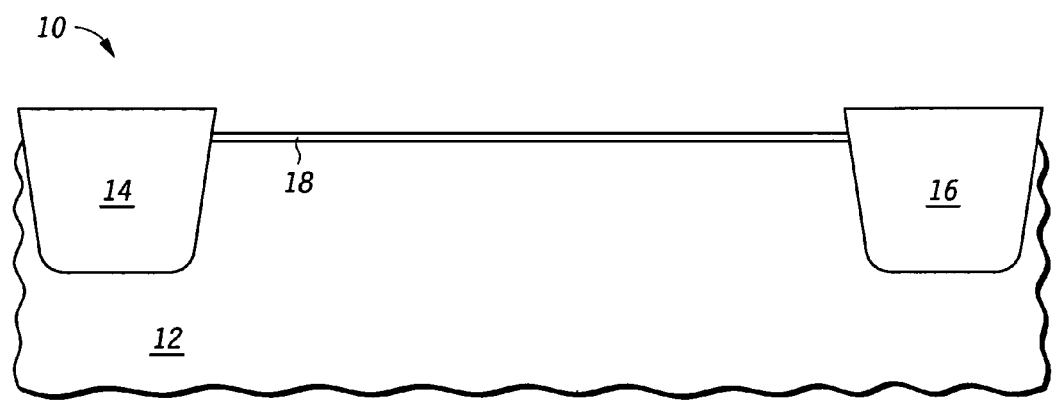
FIG. 2 illustrates a cross-sectional view of the semiconductor substrate of FIG. 1 after formation of an oxygen-rich semiconductor layer over the substrate between the local isolation regions, in accordance with one embodiment of the present invention.

FIG. 2 illustrates a cross-sectional view of semiconductor device 10 after formation of an oxygen-rich semiconductor layer 18 over active area 11 of substrate 12. In one embodiment, oxygen-rich semiconductor layer 18 is an epitaxially grown oxygen-rich crystalline silicon layer. Therefore, in this embodiment, oxygen-rich semiconductor layer 18 includes monocrystalline silicon. Alternatively, oxygen-rich semiconductor layer may include other semiconductor materials, such as, for example, silicon germanium. Also, in alternate embodiments, oxygen-rich semiconductor layer.18 may be formed using other processes. For example, a silicon layer may be formed followed by an oxygen implantation and an optional anneal, resulting in an oxygen-rich silicon layer. Alternatively, an oxygen-rich silicon layer may be deposited (using, for example, chemical vapor deposition (CVD)) over substrate 12 followed by an anneal to recrystallize the silicon. In one embodiment, oxygen-rich semiconductor layer 18 contains oxygen atoms in an amount of 2 percent in the semiconductor (e.g. silicon) crystal. Preferably, oxygen-rich semiconductor layer 18 may contain oxygen atoms in an amount of less than 3 percent. More preferably, the amount of oxygen atoms may be in range of 0.5 to 3 percent.

In the illustrated embodiment, oxygen-rich semiconductor layer 18 is formed over the recessed portion of substrate 12 between isolation regions 14 and 16. Generally, oxygen-rich semiconductor layer 18 is formed over active area 11 of substrate 12. That is, oxygen-rich semiconductor layer 18 will generally be formed over the exposed portions of substrate 12. Therefore, in the illustrated embodiment, oxygen-rich semiconductor layer 18 would also be formed on either side of isolation regions 14 and 16 (not shown). In one embodiment, where isolation regions (such as isolation regions 14 and 16) are not yet formed, oxygen-rich semiconductor layer 18 would be formed over all of substrate 12. In one embodiment, oxygen-rich semiconductor layer 18 has a thickness in a range of 5 to 60 nanometers. More preferably, the thickness may be in a range of 10 to 30 nanometers.

Figure 3:
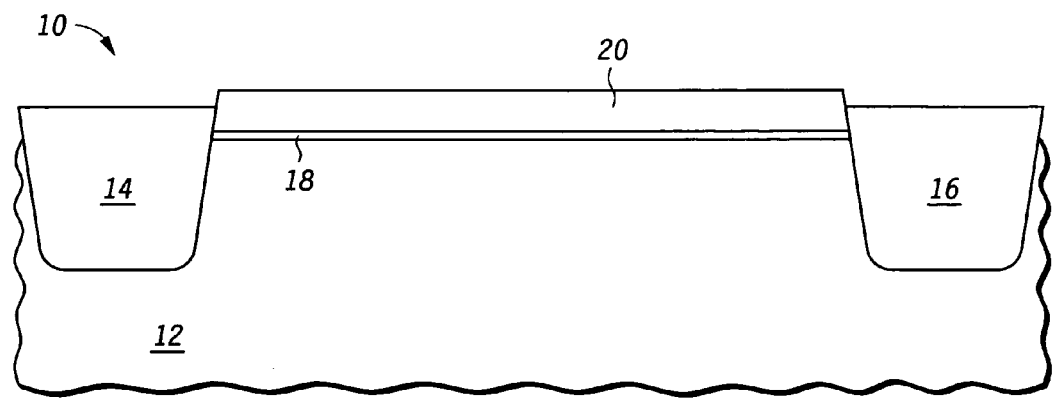
FIG. 3 illustrates a cross-sectional view of the semiconductor substrate of FIG. 2 after formation of a semiconductor layer overlying the oxygen-rich semiconductor layer, in accordance with one embodiment of the present invention.

FIG. 3 illustrates a cross-sectional view of semiconductor device 10 after formation of a semiconductor layer 20 overlying oxygen-rich semiconductor layer 18. In one embodiment, semiconductor layer 20 is an epitaxially grown silicon layer. Therefore, in this embodiment, semiconductor layer 20 includes monocrystalline silicon. This epitaxially grown silicon layer may therefore allow for definition of high performance devices. In alternate embodiments, semiconductor layer 20 may include other semiconductor materials, such as, for example, silicon germanium, gallium arsenide, silicon carbide, etc., or any combination thereof. In the illustrated embodiment, semiconductor layer 20 is formed over oxygen-rich semiconductor layer 18 between isolation regions 14 and 16. Generally, semiconductor layer 20 will be formed over all portions of oxygen-rich semiconductor layer 18. In one embodiment, semiconductor layer 20 has a thickness in a range of 10 to 150 nanometers. More preferably, the thickness may be in a range of 20 to 50 nanometers. In one embodiment, this thickness may be selected based on the desired thickness of the resulting device channel and the amount of semiconductor layer 20 that will be consumed during subsequent oxidation.

In one embodiment, semiconductor layer 20 may be deposited by selective epitaxy (as described above), thus growing silicon exclusively over oxygen-rich semiconductor layer 18 of active region 11 (and not over isolation regions 14 and 16). In an alternate embodiment, semiconductor layer 20 may be formed by blanket epitaxy. In this embodiment, semiconductor layer 20 will also be deposited over isolation regions 14 and 16. However, in the case of silicon, semiconductor layer 20 now includes polysilicon rather than monocrystalline silicon. Note that close to the edges of isolation regions 14 and 16 there may be a monocrystalline overgrowth extending active region 11 over small portions of the surfaces of isolation regions 14 and 16. This may allow more space to accommodate contacts to the source/drain regions of the resulting transistor. The remaining polysilicon overlying isolation regions 14 and 16 can then be removed by an etch that is highly selective to monocrystalline silicon. Generally, polysilicon etches much faster than monocrystalline si icon.

Figure 4:
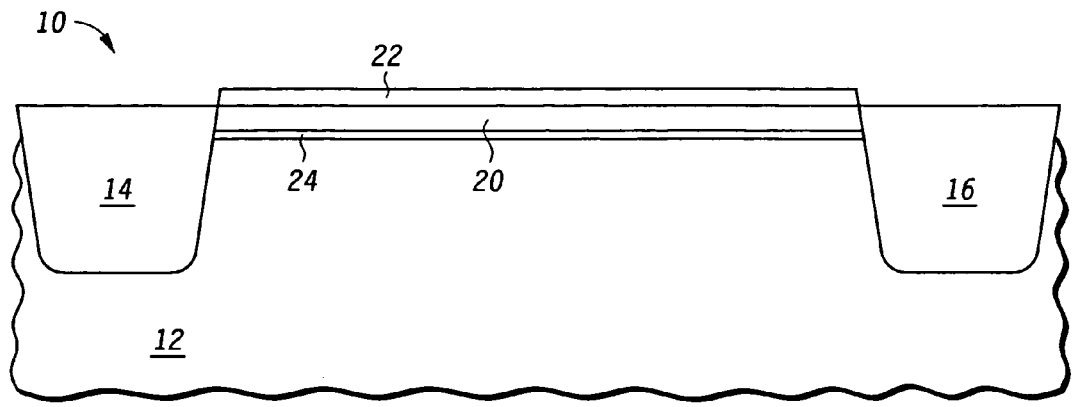
FIG. 4 illustrates a cross-sectional view of the semiconductor substrate of FIG. 3, after conversion of the oxygen-rich semiconductor layer to a dielectric layer which also results in formation of an oxide layer overlying the semiconductor layer, in accordance with one embodiment of the present invention.

FIG. 4 illustrates a cross-sectional view of semiconductor device 10 after conversion of oxygen-rich semiconductor layer 18 to a dielectric layer 24 (which may also be referred to as a semiconductor-oxide layer or an insulating layer). In one embodiment, semiconductor device 10 is oxidized, such as, for example, in a high temperature water vapor ambient (such as, for example, at a temperature between 900 and 1100 degrees Celsius). This oxidation results in the formation of an oxide layer 22 overlying semiconductor layer 20. Note that during oxidation, part of semiconductor layer 20 is consumed, thus semiconductor layer 20 in FIG. 4 may be thinner as compared to semiconductor layer 20 of FIG. 3. Although a portion of semiconductor layer 20 may be consumed, at least a portion of semiconductor layer 20 remains. Also during oxidation, oxygen atoms diffuse to oxygen-rich semiconductor layer 18 and induce internal oxidation thus transforming oxygen-rich semiconductor layer 18 into an amorphous semiconductor oxide layer. For example, when oxygen-rich semiconductor layer 18 is an oxygen-rich silicon layer, the diffused oxygen atoms transform the layer into an amorphous silicon oxide layer. In one embodiment, the thickness of oxide layer 22 is in a range of 8 to 120 nanometers, where, in one embodiment, less than half of semiconductor layer 20 is consumed during oxidation.

Note that in one embodiment, where isolation regions 14 and 16 are not present in FIG. 1, isolation regions 14 and 16 may be formed (using, for example, conventional processes) after formation of semiconductor layer 20 and prior to formation of oxide layer 22. Alternatively, isolation regions 14 and 16 may be formed after formation of oxide layer 22 and the conversion of oxygen-rich semiconductor layer 18 to dielectric layer 24.

Figure 5:
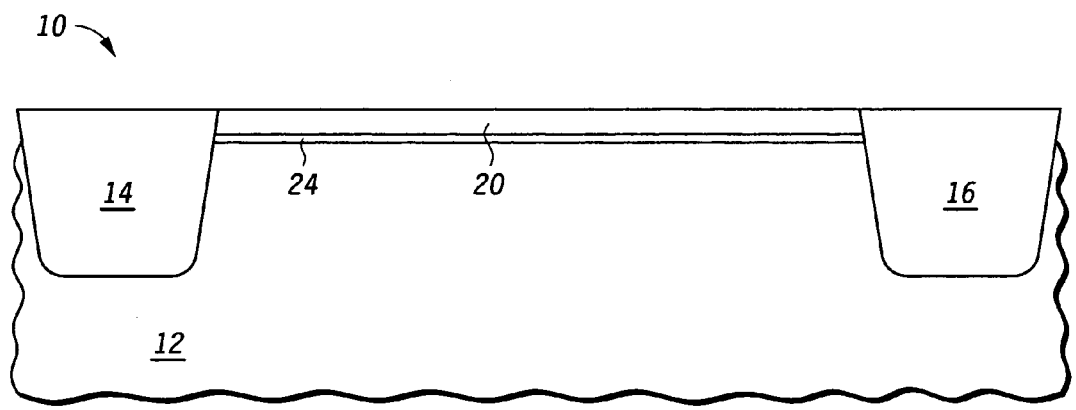
FIG. 5 illustrates a cross-sectional view of the semiconductor substrate of FIG. 4 after removal of at least a portion of the oxide layer over the semiconductor layer, in accordance with one embodiment of the present invention.

FIG. 5 illustrates a cross-sectional view of semiconductor device 10 after removal of at least a portion of oxide layer 22. In one embodiment, all of oxide layer 22 is removed using conventional etch processes, such as, for example, an HF or plasma etch. Therefore, in this embodiment, subsequent layers will be formed directly on semiconductor layer 20. Alternatively, none or only a portion of oxide layer 22 may be removed such that subsequent layers are formed over the remaining portion of oxide layer 22.

Note that, as seen in FIG. 5, a local SOI region has been formed between isolation regions 14 and 16 which includes a semiconductor layer overlying an insulating layer where any type of transistor may subsequently be formed. As was described above, the local SOI region may be formed by converting an oxygen-rich semiconductor layer underlying a semiconductor layer to a dielectric or insulating layer. That is, in one embodiment, a first layer (such as, for example, oxygen-rich semiconductor layer 18) having a monocrystalline lattice is formed over substrate 12, where the first layer includes a first material of semiconductor type (such as, for example, silicon) and a second material (such as, for example, oxygen), where the second material is of a first type different from the semiconductor type and occupies locations in the monocrystalline lattice. A second layer (such as, for example, semiconductor layer 20) can then be epitaxially grown directly on the first layer, where the second layer includes a third material (such as, for example, silicon) of the semiconductor type. After epitaxially growing the second layer, the first layer is converted to an insulating layer (such as, for example, dielectric layer 24) while retaining at least a portion of the second layer as being of the semiconductor type by applying a reactant directly to the second layer. For example, the reactant may include high temperature water vapor. Also, in one embodiment, the second material (such as, for example, oxygen) in the first layer (such as, for example, oxygen-rich semiconductor layer 18) is less than about 3% of the crystal lattice of the semiconductor material (such as, for example, silicon) of the first layer.

Figure 6:
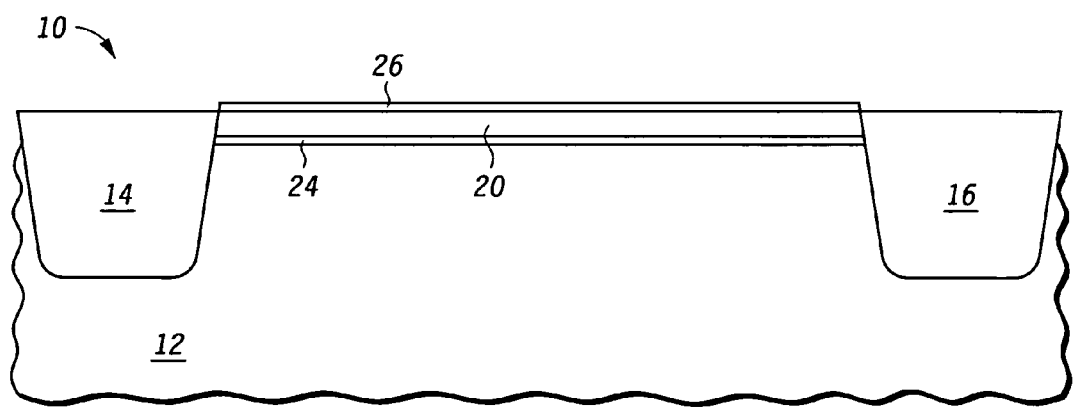
FIG. 6 illustrates a cross-sectional view of the semiconductor substrate of FIG. 5 after formation of a gate dielectric layer overlying the semiconductor layer, in accordance with one embodiment of the present invention.

FIG. 6 illustrates a cross-sectional view of semiconductor device 10 after formation of a gate dielectric layer 26 over semiconductor layer 20. Note that if oxide layer 22 is not completely removed, semiconductor device 10 of FIG. 6 may include a remaining portion (or all of) oxide layer 22 between the remaining portion of semiconductor layer 20 and gate dielectric layer 26. Gate dielectric layer 26 may include any material or materials suitable for gate dielectrics, such as, for example, silicon oxide, silicon oxynitride, nitrided oxide, hafnium oxide, zirconium oxide, metal silicate, metal oxy-nitride, metal-silicon-oxynitride, other metal oxides, any high dielectric constant (K) material, or any combination thereof. Gate dielectric layer 26 may be formed using conventional deposition or growth techniques such as Atomic Layer Deposition (ALD), chemical vapor deposition (CVD), plasma enhanced CVD (PECVD), metal organic CVD (MOCVD), or physical vapor deposition (PVD).

Figure 7:
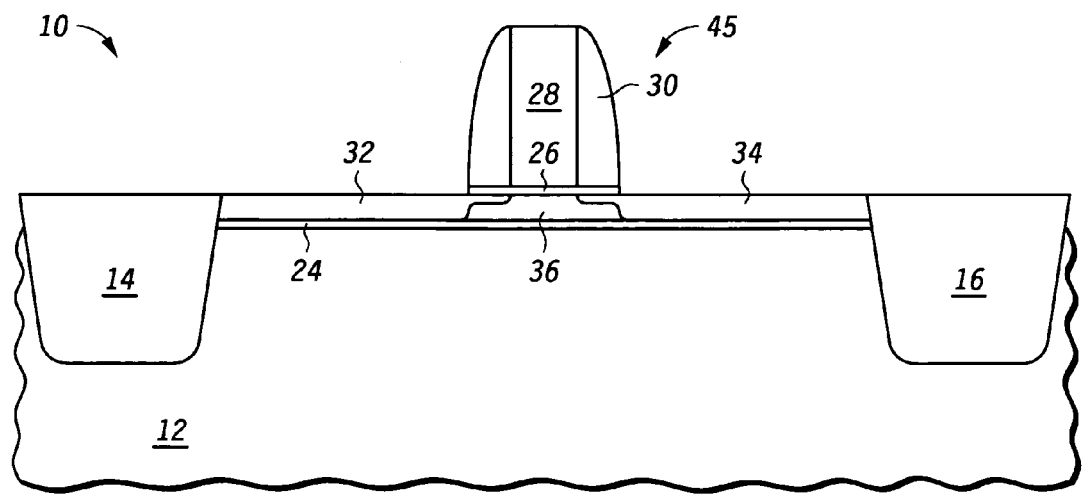
FIG. 7 illustrates a cross-sectional view of the semiconductor substrate of FIG. 6 after formation of a substantially completed semiconductor device, in accordance with one embodiment of the present invention.

FIG. 7 illustrates a cross-section view of semiconductor device 10 after formation of a substantially completed transistor 45. Transistor 45 includes a gate electrode 28 overlying gate dielectric 26 and spacers 30 adjacent gate electrode 28 and overlying gate dielectric 26. Note that conventional processes may be used in the formation of gate dielectric 26, gate electrode 28, and spacers 30. Also note that any type of device may be formed. In one embodiment, gate electrode 28 may be a polysilicon gate, a metal gate, a silicide gate, or any suitable combination thereof. For example, if gate electrode 28 is a metal gate, gate electrode 28 may include titanium nitride, tantalum silicon nitride, any metal carbide, boride, or their nitrides, or any combination thereof. Note also that gate electrode 28 may be a gate electrode stack having multiple layers. Spacers 30 may be any appropriate spacers as known in the art. For example, spacers 30 may include silicon dioxide, silicon nitride, silicon germanium, etc. Also note that spacers 30 may include a combination of materials. For example, a liner layer (not shown) may be used.

Transistor 45 includes source/drain regions 32 and 34 formed in semiconductor layer 20, where source/drain regions 32 and 34 extend under spacers 30 and may partially extend under gate electrode 28. Therefore, a channel region 36 is formed in the remaining portion of semiconductor layer 20, under gate electrode 28 and between source/drain regions 32 and 34 such that source/drain regions 32 and 34 are laterally spaced from channel region 36. Each of source/drain regions 32 and 34 includes a deep source/drain region which extends deeper into semiconductor layer 20 and is defined by spacers 30 and includes an extension region which laterally extends from the deep source/drain region under spacer 30 and may extend partially under gate electrode 28. In one embodiment, the extensions are implanted prior to formation of spacers 30 and the deep source/drain regions are implanted after formation of spacers 30, as known in the art. Note that in the illustrated embodiment, the deep source/drain regions of source/drain regions 32 and 34 extend all the way to dielectric layer 24. Therefore, in this embodiment, the depth of source/drain regions 32 and 34 corresponds to the thickness of semiconductor layer 20. However, in alternate embodiments, the deep source/drain regions of source/drain regions 32 and 34 may not fully extend to dielectric layer 24.

Note that in the illustrated embodiment, dielectric layer 24 extends between isolation regions 14 and 16, under source/drain regions 32 and 34. This may allow for improved electrical isolation of source/drain regions 32 and 34. In this manner, punch through effects between source/drain regions 32 and 34 may be reduced or minimized. This may also allow for improved characteristics of the resulting transistor at shorter gate lengths.

In an alternate embodiment, after formation of gate electrode 28 and spacers 30, but before formation of source/drain regions 32 and 34, an anisotropic etch may be performed to remove regions of semiconductor layer 20 and dielectric layer 24 on either side of gate electrode 28 (between spacers 30 and isolation regions 14 and 16). After the anisotropic etch, the recessed regions may be restored by a selective semiconductor epitaxial process to form source/drain regions. This semiconductor epitaxial process can be performed, for example, with silicon, doped silicon, silicon germanium, doped silicon germanium, silicon carbon, doped silicon carbon, silicon carbon germanium, doped silicon carbon germanium, etc. This alternate embodiment may allow for deeper source/drain regions (as compared, for example, to source/drain regions 32 and 34) which may therefore allow for lower sheet resistance. However, in this embodiment, the source/drain regions would not include an underlying dielectric layer (such as dielectric layer 24) and may therefore be more prone to punch through effects.

Figure 8:
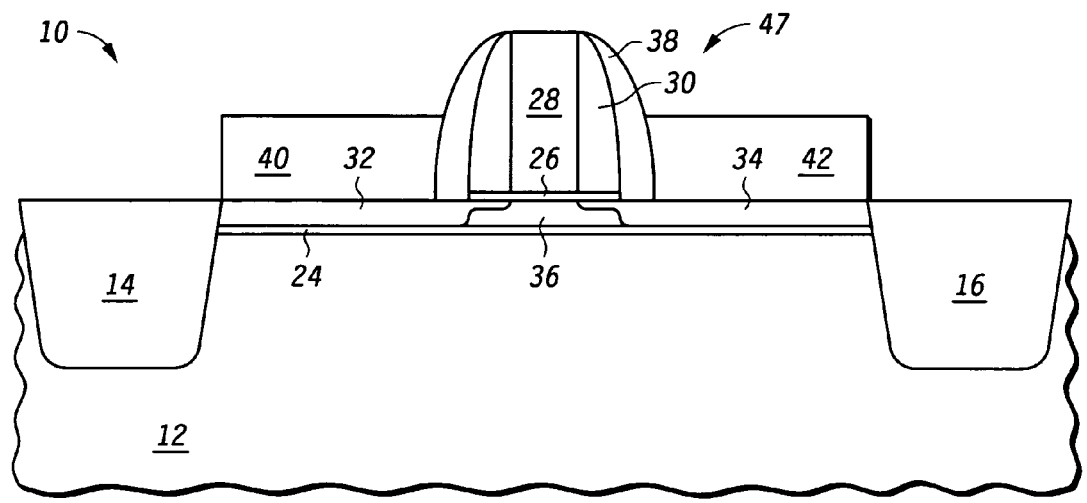
FIG. 8 illustrates a cross-sectional view of the semiconductor substrate of FIG. 6 after formation of a substantially completed semiconductor device having raised source/drains, in accordance with an alternate embodiment of the present invention.

FIG. 8 illustrates a cross-sectional view of semiconductor device 10 after formation of a substantially completed transistor 47 in accordance with an alternate embodiment of the present invention (in which like numbers indicate like elements). Transistor 47 of FIG. 8 is similar to transistor 45 of FIG. 7; however, in addition to gate electrode 28 and spacers 30, transistor 47 also includes spacers 38 adjacent spacers 30 and raised source/drains 40 and 42 overlying source/drain regions 32 and 34. (Note that the descriptions provided above with respect to gate dielectric 26, gate electrode 28, spacers 30, and source/drain regions 32 and 34 also apply here in reference to FIG. 8.) Spacers 38 can be formed of any type of material, similar to spacers 30, and may also include a combination of materials. In one embodiment, raised source/drains 40 and 42 may be formed using a selective semiconductor epitaxial process. This semiconductor epitaxial process can be performed, for example, with silicon, doped silicon, silicon germanium, doped silicon germanium, silicon carbon, doped silicon carbon, silicon carbon germanium, doped silicon carbon germanium, etc. In one embodiment, raised source/drains 40 and 42 are formed to decrease the external resistances from the channel to the contacts. (Note that raised source/drains 40 and 42 may also be referred to as elevated source/drains 40 and 42.) In one embodiment, deep source/drain implants may be performed after formation of spacers 38 and either prior or subsequent to the formation of elevated source/drains 40 and 42.

After formation of the substantially completed devices of FIGS. 7 and 8 (i.e. transistors 45 and 47, respectively), subsequent processing, as known in the art, may be performed to fully complete the devices, and to form, for example, an integrated circuit. Also, note that in the formation of transistors 45 and 47, other steps may be performed in addition to those described above. For example, in an alternate embodiment (not illustrated), a well implant may be performed to form a well region within substrate 12 between isolation regions 14 and 16. In one embodiment, this well implant may be performed before formation of gate dielectric layer 26. The well region can be formed using known implant processes to improve device performance. Also note that the well implant may be implanted into semiconductor layer 20 to affect threshold voltage of the device. Similarly, additional implants may be performed or those implants described above may be performed differently.

Note that FIGS. 7 and 8 provide only two examples (e.g. transistors 45 and 47) of the type of devices that may be formed in the local SOI region formed between isolation regions 14 and 16, but alternate embodiments may form any type of device in the local SOI region. For example, in one embodiment, after removal of oxide layer 22, fins of a FinFET device may be formed using semiconductor layer 20.

Therefore, it can be appreciated how embodiments of the present invention allow for the integration of higher performance SOI devices onto a bulk semiconductor substrate through the formation of local SOI regions. The devices formed in the local SOI regions may also result in improved characteristics, due, for example, to the underlying dielectric layer (such as dielectric layer 24).

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method, comprising:
   providing a substrate having an active region that has a top surface;
   forming a first layer over the top surface, wherein the first layer comprises an oxygen-rich, semiconductor-material layer;
   epitaxially growing a second layer directly on the first layer, wherein the second layer comprises a semiconductor-material layer;
   converting the first layer to a semiconductor-oxide layer; and
   forming a transistor, wherein a channel of the transistor is formed only in the second layer.

2. The method of claim 1, wherein a deep source and a deep drain of the transistor are formed only in the second layer.

3. The method of claim 2, wherein the deep source and the deep drain extend to the semiconductor-oxide layer.

4. The method of claim 2, wherein the transistor is further characterized as having an elevated source over the deep source and an elevated drain over the deep drain.

5. The method of claim 2, wherein a gate dielectric of the transistor is formed on the second layer, without an intervening semiconductor layer between the second layer and the gate dielectric.

6. The method of claim 1, wherein a source and a drain of the transistor extend to the semiconductor-oxide layer.

7. The method of claim 1, wherein the oxygen-rich, semiconductor-material layer comprises oxygen-rich silicon.

8. The method of claim 1, wherein the second layer comprises monocrystalline silicon.

9. The method of claim 8, wherein the first layer comprises oxygen-rich monocrystalline silicon.

10. The method of claim 1, wherein the converting further comprises forming an oxide layer on a top surface of the second layer.

11. The method of claim 10, further comprising
    removing at least a portion of the oxide layer; and
    forming a gate dielectric on the second layer.

12. The method of claim 11, wherein the transistor further comprises a gate over the gate dielectric, and a deep source and a deep drain in the second layer and laterally spaced from the channel, wherein the channel is under the gate and the deep source and the deep drain are formed only in the second layer.

13. The method of claim 12, wherein the substrate comprises silicon.

14. The method of claim 12, wherein the converting comprises introducing high temperature water vapor over the second layer.

15. The method of claim 12, wherein the transistor is farther characterized as having an elevated source over the deep source and an elevated drain over the deep drain.

16. The method of claim 12, wherein the gate dielectric is formed directly on the second layer.

17. A method, comprising:
    providing a substrate having an active region that has a top surface;
    forming a first layer over the top surface, wherein the first layer comprises an oxygen-rich, semiconductor-material layer;
    epitaxially growing a second layer directly on the first layer, wherein the second layer comprises a semiconductor-material layer;
    converting the first layer to a semiconductor-oxide layer; and
    forming a gate dielectric on the second layer, wherein there is no semiconductor layer between the gate dielectric and the second layer.

18. The method of claim 17, wherein the gate dielectric is formed directly on the second layer.

19. The method of claim 17, further comprising forming a transistor having a gate over the gate dielectric, a channel under the gate and in the second layer, a deep source and a deep drain in the second layer and laterally spaced from the channel.

20. The method of claim 19, wherein the deep source and the deep drain extend to the semiconductor-oxide layer.

21. The method of claim 19, wherein the converting further comprises forming an oxide layer on a top surface of the second layer, and wherein the method further comprises:

removing at least a portion of the oxide layer prior to forming the gate dielectric.

22. The method of claim 17, wherein the oxygen-rich, semiconductor-material layer comprises oxygen-rich silicon.

23. The method of claim 17, wherein the second layer comprises monocrystalline silicon, and the first layer comprises oxygen-rich monocrystalline silicon.

24. A method, comprising:

providing a substrate having an active region that has a top surface, a first isolation region, and a second isolation region;

selectively forming a first layer over the top surface between the first and second isolation regions, wherein the first layer comprises an oxygen-rich, semiconductor-material layer;

selectively epitaxially growing a second layer directly on the first layer between the first and second isolation regions, wherein the second layer comprises a semiconductor-material layer, and wherein the second layer is not formed on the first and second isolation regions; and converting the first layer to a semiconductor-oxide layer.

25. The method of claim 24, further comprising:

forming a transistor over the second layer, the transistor having a gate dielectric over the second layer, a channel under the gate in the second layer, a deep source and deep drain in the second layer and laterally spaced from the channel, wherein the channel, the deep source, and the deep drain are formed only in the second layer.

26. The method of claim 25, wherein the deep source and the deep drain extend to the semiconductor-oxide layer.

* * * * *